(12) United States Patent
Chan et al.

(10) Patent No.: US 9,698,043 B1
(45) Date of Patent: Jul. 4, 2017

(54) SHALLOW TRENCH ISOLATION FOR SEMICONDUCTOR DEVICES

(71) Applicant: INTERNATIONAL BUSINESS MACHINES CORPORATION, Armonk, NY (US)

(72) Inventors: Kevin K. Chan, Staten Island, NY (US); Stephan A. Cohen, Wappingers Falls, NY (US); Alfred Grill, White Plains, NY (US); Deborah A. Neumayer, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/161,182

(22) Filed: May 20, 2016

(51) Int. Cl.
| | |
|---|---|
| H01L 21/762 | (2006.01) |
| H01L 21/02 | (2006.01) |
| H01L 21/3065 | (2006.01) |
| H01L 21/311 | (2006.01) |

(52) U.S. Cl.
CPC .... *H01L 21/76224* (2013.01); *H01L 21/0228* (2013.01); *H01L 21/02175* (2013.01); *H01L 21/02274* (2013.01); *H01L 21/3065* (2013.01); *H01L 21/31111* (2013.01)

(58) Field of Classification Search
CPC ......... H01L 21/76224; H01L 21/02175; H01L 21/31111; H01L 21/0228; H01L 21/3065; H01L 21/02274
See application file for complete search history.

(56) References Cited

U.S. PATENT DOCUMENTS

| | | | | |
|---|---|---|---|---|
| 5,036,373 A | * | 7/1991 | Yamazaki | C23C 16/274 257/103 |
| 5,139,970 A | * | 8/1992 | Yamazaki | C23C 16/274 257/E29.02 |
| 5,306,530 A | * | 4/1994 | Strongin | C23C 16/46 427/294 |
| 5,483,920 A | * | 1/1996 | Pryor | C23C 14/022 117/106 |
| 5,923,991 A | | 7/1999 | Bronner | |
| 6,040,600 A | * | 3/2000 | Uenishi | H01L 21/26546 257/330 |
| 6,054,343 A | | 4/2000 | Ashburn | |
| 6,146,970 A | | 11/2000 | Witek | |
| 6,709,951 B2 | | 3/2004 | Beyer | |
| 7,022,583 B1 | * | 4/2006 | Leng | H01L 21/76224 257/513 |
| 7,652,334 B2 | | 1/2010 | Furukawa | |

(Continued)

OTHER PUBLICATIONS

Panadyne, Hexagonal Boron Nitride Powder (HBN), Web Page: panadyne.com/hexagonal_boron_nitride_powder.html, Oct. 6, 2015, pp. 1-2, Panadyne Inc., 516 Stump Road, Montgomeryville, PA, USA.

*Primary Examiner* — Jarrett Stark
(74) *Attorney, Agent, or Firm* — Louis J. Percello; Robert M. Trepp

(57) ABSTRACT

A substrate incorporating semiconductor regions electrically isolated by shallow trenches filled with hexagonal, textured or columnar boron nitride. A process for filling shallow trenches in a semiconductor substrate with columnar textured boron nitride using pulsed plasma enhanced chemical vapor deposition (Pulsed PECVD) and plasma assisted atomic layer deposition (PAALD).

5 Claims, 7 Drawing Sheets

(56) References Cited

U.S. PATENT DOCUMENTS

| | | | |
|---|---|---|---|
| 7,807,546 B2 | 10/2010 | Lee | |
| 8,133,797 B2 | 3/2012 | van Schravendijk | |
| 2002/0197823 A1* | 12/2002 | Yoo | H01L 21/76232 438/424 |
| 2004/0083973 A1* | 5/2004 | Sakamoto | C04B 35/583 118/723 I |
| 2004/0152274 A1* | 8/2004 | Park | H01L 21/76264 438/300 |
| 2010/0099236 A1* | 4/2010 | Kwon | H01L 21/02112 438/435 |
| 2012/0146175 A1 | 6/2012 | Loubet | |
| 2013/0020648 A1* | 1/2013 | Wu | H01L 29/7846 257/368 |
| 2016/0351664 A1* | 12/2016 | Leobandung | H01L 27/1211 |
| 2016/0365287 A1* | 12/2016 | Leobandung | H01L 21/82381 |

* cited by examiner

US 9,698,043 B1

SHALLOW TRENCH ISOLATION FOR SEMICONDUCTOR DEVICES

BACKGROUND

The present invention relates to a process to form semiconductor regions in a semiconductor substrate using shallow trench isolation (STI) and more particularly, to a semiconductor substrate with filler material in trenches and method for forming filler material.

BRIEF SUMMARY OF THE INVENTION

In accordance with the present invention, a structure is described comprising a substrate having a plurality of semiconductor regions, the substrate having an upper surface and a plurality of trenches formed in the upper surface of the semiconductor substrate for electrically isolating at least two of the plurality of semiconductor regions; the plurality of trenches having sidewalls and a bottom; the plurality of trenches having a liner on the sidewalls; the plurality of trenches having an insulating material therein substantially filling the plurality of trenches to the upper surface, the insulating material comprising a textured or columnar boron nitride and/or hexagonal boron nitride.

The invention further provides a method of forming a structure comprising selecting a semiconductor substrate having an upper surface; forming a plurality of trenches having sidewalls and a bottom in the upper surface of the semiconductor substrate to form a plurality of semiconductor regions bounded by the plurality trenches; forming a liner layer on the sidewalls of the trenches; and substantially filling the plurality of trenches with an insulating material comprising textured or columnar boron nitride and/or hexagonal boron nitride, wherein substantially filling includes a process selected from the group consisting of pulsed plasma enhanced chemical vapor deposition (Pulsed PECVD) and plasma assisted atomic layer deposition (PAALD), the process operating with the semiconductor substrate at a temperature in the range from 150° C. to 400° C.

The invention further provides a structure comprising a substrate having a plurality of semiconductor regions having a first respective upper surface and a plurality of insulating regions, the insulating regions having a second respective upper surface, the insulating regions electrically isolating at least two of the semiconductor regions, the insulating regions comprising textured or columnar boron nitride and/or hexagonal boron nitride.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which.

DETAILED DESCRIPTION

Figure 1:
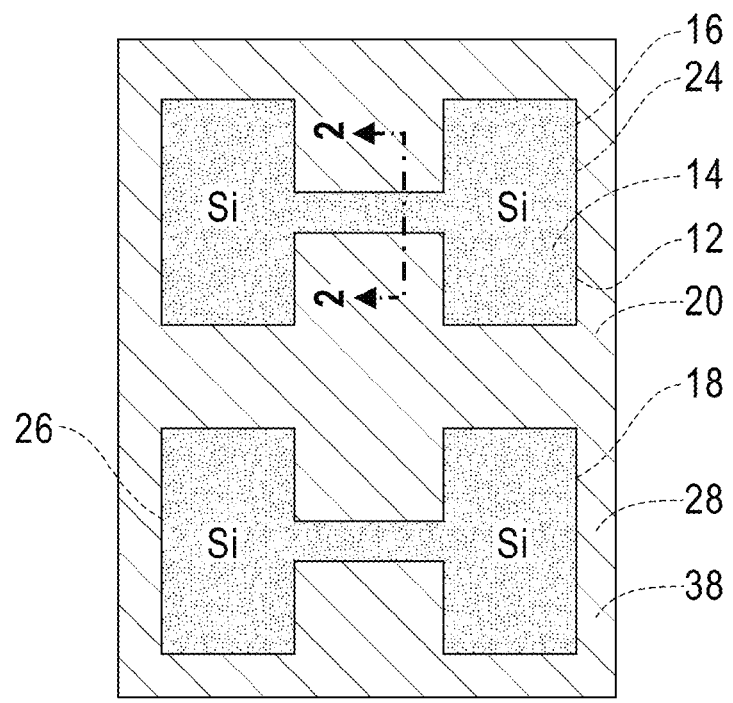
FIG. 1 is a top view of one embodiment of the invention showing semiconductor regions bounded by a plurality of trenches in a substrate.

Referring now to the drawing, FIG. 1 shows a top view of a one embodiment of the invention showing a semiconductor substrate 12 having an upper surface 14 and a plurality of semiconductor regions 16 and 18 having an upper surface 14 and bounded by a plurality of trenches 20. Plurality of trenches 20 have sidewalls 24 and 26 respectively on semiconductor regions 16 and 18 and a trench bottom 28 shown in FIG. 2 on semiconductor substrate 12. Semiconductor substrate 12 and semiconductor regions 16 and 18 may comprise Si, Group III-V, Ge, SiGe and combinations thereof.

Figure 2:
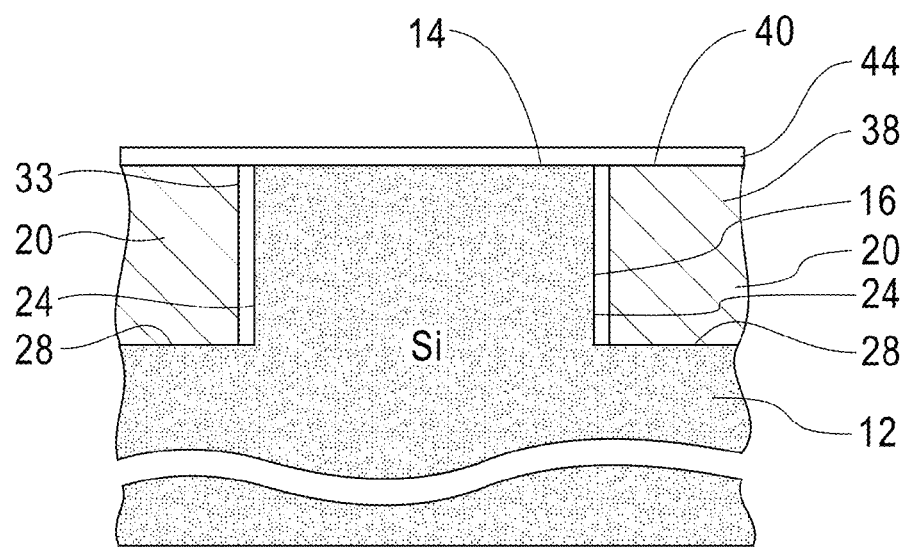
FIG. 2 is a cross-section view along the lines 2-2 of FIG. 1.

FIG. 2 is a cross-section view along the lines 2-2 of FIG. 1. Plurality of trenches 20 may have a liner 33 (not shown in FIG. 1) on sidewalls 24 and 26. Plurality of trenches 20 have an insulating material 38 filled therein to substantially fill plurality of trenches 20 to an upper surface 40. Upper surface 40 may be coplanar with upper surface 14. Insulating material 38 may comprise a nitride such as textured or columnar boron nitride and/or hexagonal boron nitride. Liner 33 may comprise silicon nitride and provides an adhesion layer and a diffusion barrier to atoms from insulating material 38.

Oxide layer 44 is shown in FIG. 2 formed over upper surface 14 and upper surface 40. Oxide layer 44 may be silicon oxide or silicon oxy-nitride and has a thickness in the range from 0 to 10 nm and preferably in the range from 3 to 7 nm.

Insulating material 38 may be formed in trenches 20 by a process selected from the group consisting of pulsed plasma enhanced chemical vapor deposition (Pulsed PECVD) and plasma assisted atomic layer deposition (PAALD). The deposition process selected is operated with the semiconductor substrate at a temperature in the range from 150° C. to 400° C.

At times when the plasma assisted atomic layer deposition (PAALD) process is selected, the process includes flowing 1% $B_2H_6$, into a chamber for a first time period, flushing the chamber for a second time period by flowing $H_2$, $N_2$, He or Ar into the chamber before introducing a nitriding or nitrogen containing gas selected from $N_2$, $N_2$ and $H_2$, $NH_3$, $N_2H_4$, dimethylhydrazine and forming a plasma in the chamber for a third time period with nitriding or nitrogen containing gas without $B_2H_6$ present. Then flushing the chamber for a fourth time period by flowing $H_2N_2$, He or Ar into the chamber. The $B_2H_6$/He/$N_2+H_2$/$N_2+H_2$+plasma/He sequence is repeated until the desired film thickness is achieved. The preferred flow rate of 1% $B_2H_6$ in He is 50-5000 sccm, $N_2$ is 50-5000 sccm and $H_2$ is 50-5000 sccm. The plasma power range is from 100 to 1500 W, pressure is from 0.5 to 12 millitorr, and susceptor temperature is from 150° C. to 400° C. Pulse times for each step are in the range from 0.1 to 60 seconds.

Example 1

In a preferred embodiment the plasma assisted atomic layer deposition (PAALD) was conducted in an Applied Materials, Inc. (AMAT) Centura platform DxZ PECVD chamber at 400° C. A wafer is introduced into the deposition chamber with the susceptor already heated to 400° C. 500 sccm of 1% diborane in He is flowed into the chamber for 5 seconds, then the chamber is flushed with 1000 sccm of He for 5 seconds. The nitriding or nitrogen containing gas consisting of 900 sccm of $N_2$ and 100 sccm of $H_2$ is flowed into the chamber for 5 seconds before striking a plasma at 200 watts for 5 seconds. The plasma is terminated and the chamber is flushed with 1000 sccm of He. The $B_2H_6$/He/$N_2+H_2$/$N_2+H_2$+plasma/He sequence is repeated until the desired film thickness is achieved. The inventors have discovered an optimal process space of 400° C. susceptor temperature, 2 torr, 200 watts, 500 sccm of 1% $B_2H_6$ in He and a total flow of $N_2$ and $H_2$ to be 1000 sccm with a ratio of $N_2>H_2$ to maximize etch resistance of the deposited boron nitride film as shown in table I. Additionally, the inventors have discovered that care must be taken in seasoning the deposition chamber prior to BN deposition to minimize interfacial oxide and inadvertent uptake of oxygen into the BN film which diminishes its etch resistance.

At times when the Pulsed PECVD process is selected, the process would include flowing $B_2H_6$, $H_2$ and $N_2$ into a chamber, forming a first plasma in said chamber for a first time period, terminating said plasma, flushing said chamber for a second time period by flowing $H_2$ and $N_2$ into said chamber and forming a second plasma in said chamber for a third time period with $H_2$ and $N_2$ and without $B_2H_6$ present. The $B_2H_6+N_2+H_2$+plasma/$N_2+H_2$/$N_2+H_2$+plasma sequence is repeated until the desired film thickness is achieved. The preferred flow rate of 1% $B_2H_6$ in He is 50-5000 sccm, $N_2$ is 50-5000 sccm and $H_2$ is 50-5000 sccm. The plasma power range is from 100 to 1500 W, pressure is from 0.5 to 12 millitorr, and susceptor temperature is from 150° C. to 400° C. Pulse times for each step range from 0.1 to 60 seconds.

Example 2

In a preferred embodiment the Pulsed PECVD process was conducted in an AMAT Centura platform DxZ PECVD chamber at 400° C. A wafer is introduced into the deposition chamber with the susceptor already heated to 400° C. 500 sccm of 1% diborane in He, 900 sccm of $N_2$ and 100 sccm of $H_2$ are flowed into the chamber and a plasma struck at 200 watts for 5 seconds. The plasma is terminated and the flow 500 sccm of 1% diborane in He is stopped but continuing to flow 500 sccm of $N_2$ and $H_2$ for 5 seconds before striking a second plasma with just $N_2$ and $H_2$ and no $B_2H_6$ in the deposition chamber at 200 watts for 5 seconds. The $B_2H_6+N_2+H_2$+plasma/$N_2+H_2$/$N_2+H_2$+plasma sequence is repeated until the desired film thickness is achieved. The resultant films are textured as revealed by the TEM image in FIG. 3.

Figure 3:
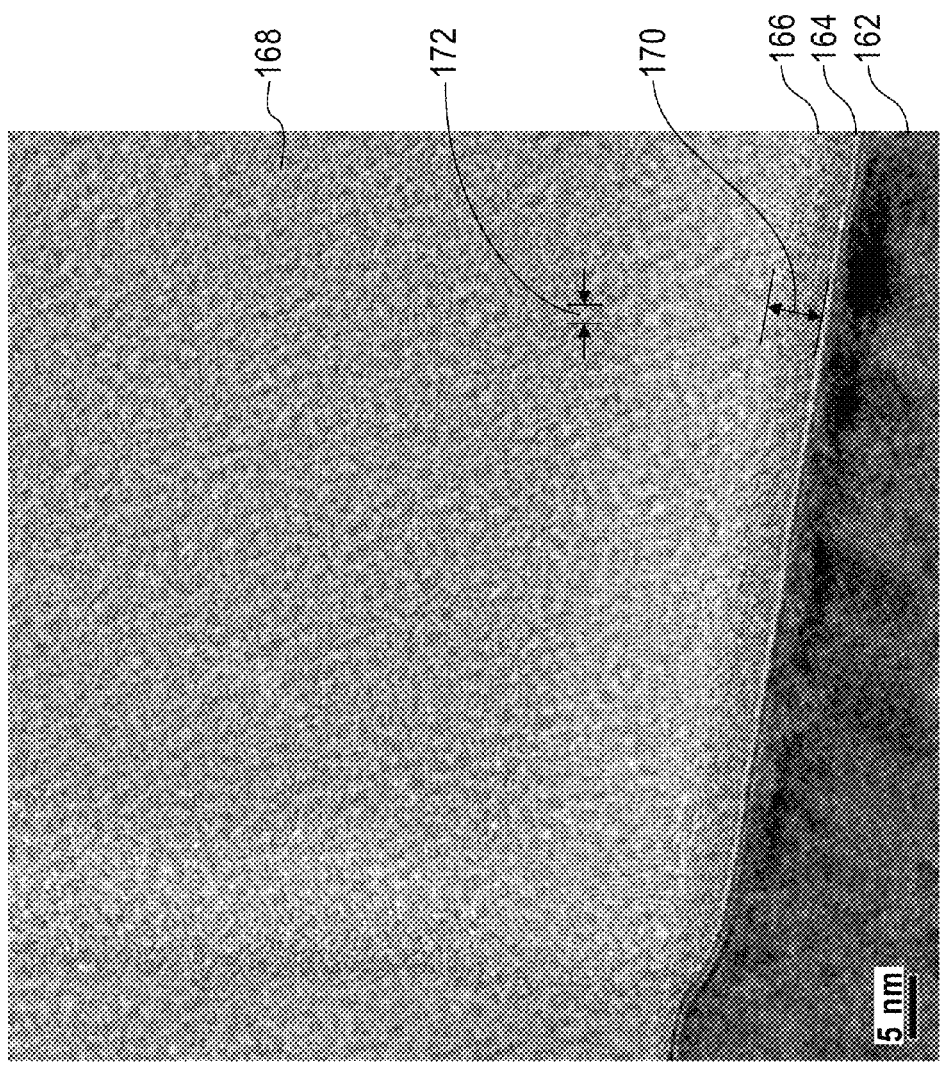
FIG. 3 is a transmission electron microscope (TEM) image of a cross-section view and upper surface of a layer of textured or columnar boron nitride on a layer of silicon oxide on a silicon substrate.

In FIG. 3, substrate or wafer 162 is single crystalline silicon, layer 164 is silicon oxide and layer 166 is textured of columnar boron nitride having an upper surface 168. Arrow 170 shows the thickness of layer 166. As shown in FIG. 3, upper surface 168 has a textured surface with surface hills and valleys spaced apart from hill to hill in the range about from 0.8 to 1.7 nm shown by arrow 172.

Additionally, the inventors have found an optimal process parameter space of 400° C. susceptor temperature, 2 torr, 500 sccm of 1% $B_2H_6$ in He and a total flow of $N_2$ and $H_2$ to be 1000 sccm with a ratio of $N_2>H_2$ selected to maximize the etch resistance of the deposited boron nitride film as shown in Table I below. In Table I, the columns correspond to $N_2$ flow, $H_2$

TABLE I

| N2 flow (sccm) | H2 flow (sccm) | dep rate A/cycle | RIE etch rate A/min | O2 ash etch rate A/min | SN etch rate A/min | HF etch rate A/min |
|---|---|---|---|---|---|---|
| 250 | 750 | 8.3 | 78 | 12 | 2.5 | 2.3 |
| 500 | 500 | 12 | 55 | 13 | 3.9 | 2.7 |
| 750 | 250 | 14 | 69 | 11 | 1.7 | 0 |
| 900 | 100 | 14 | 66 | 11 | 1.9 | 0 |
| 2000 | 40 | 15 | 75 | 16 | 4.0 | 0 | flow, deposition rate, RIE etch rate, $O_2$ ashing etch rate, 10 minute Sulfuric nitric acid (SN) etch rate and 5 minute 100:1 HF etch rate. The five rows of data were settings for $N_2$ flow, $H_2$ flow for depositing BN layers or films and the subsequent measurement of etch rates of these films under etching conditions of, SN etching solution and HF etching.

Figure 4:
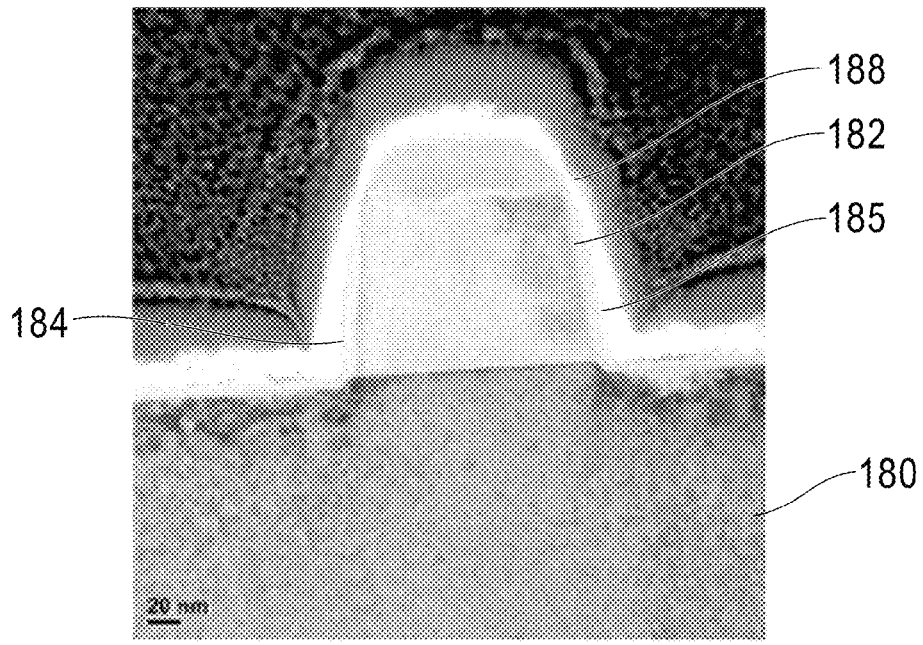
FIG. 4 is a TEM image of a cross-section view of a conformal layer formed over a substrate and gate stack of a transistor of textured or columnar boron nitride formed with plasma power of 500 watts.
Figure 5:
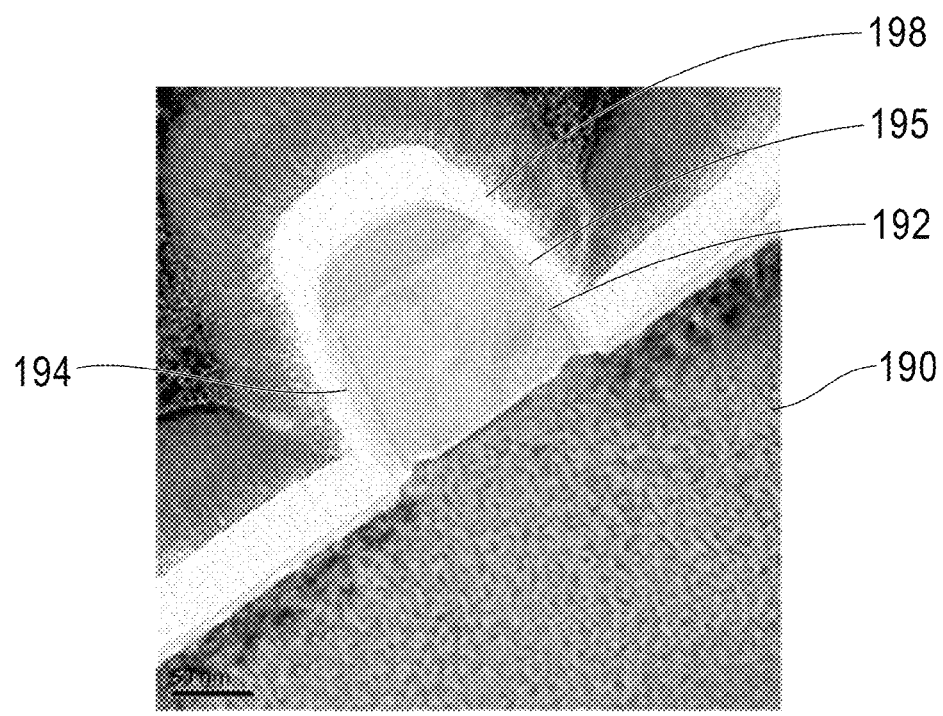
FIG. 5 is a TEM image of a cross-section view of a conformal layer formed over a substrate and gate stack of a transistor of dense textured or columnar boron nitride formed with plasma power of 200 watts.

The inventors have also found an optimal power of 200 watts. Boron nitride deposited or formed with 500 watts resulted in a granular film or layer with uneven deposition as shown in FIG. 4. FIG. 4 shows a substrate 180, an MOS field effect transistor (MOSFET) gate stack 182, sidewall spacers 184 and 185, and a conformal granular boron nitride layer 188. Boron nitride deposited or formed with 200 watts resulted in a dense conformal film or layer as shown in FIG. 5. FIG. 5 shows a substrate 190, an MOSFET gate stack 192, sidewall spacers 194 and 195, and a conformal dense boron nitride layer 198.

Figure 6:
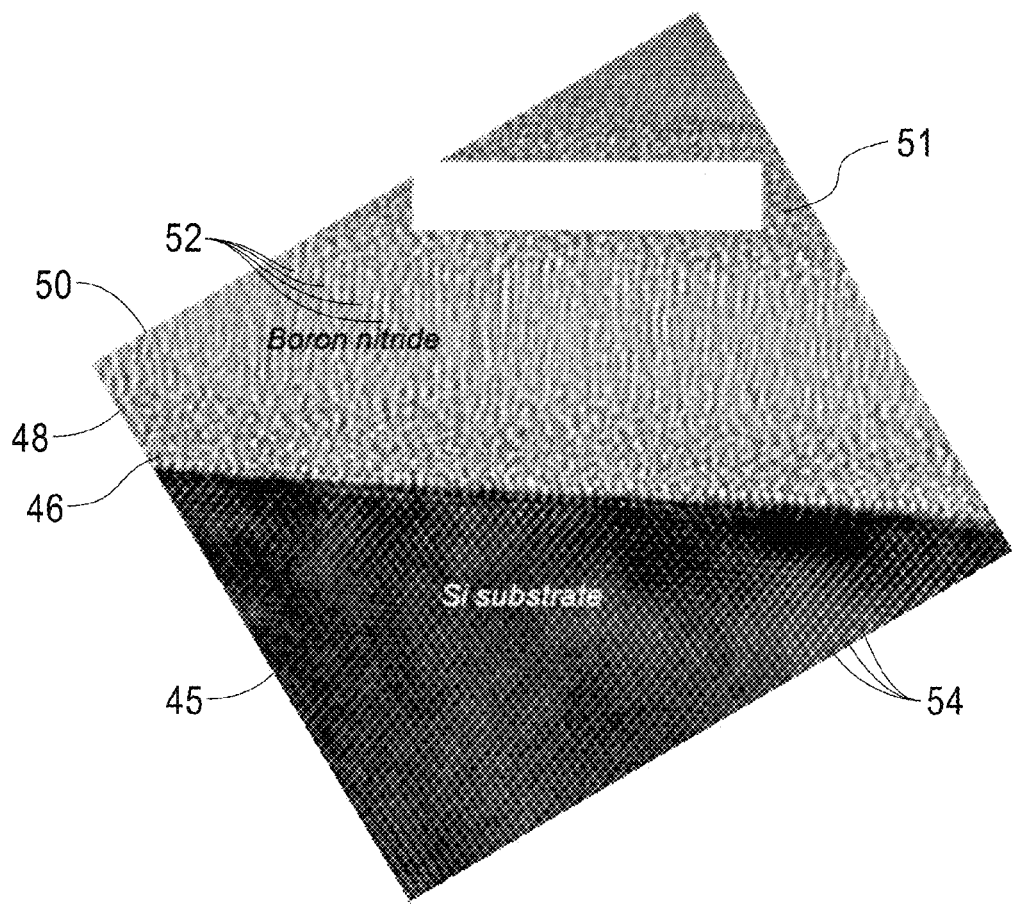
FIG. 6 is a TEM image of a cross-section view of a layer of textured or columnar boron nitride on a layer of silicon oxide on a silicon substrate.

FIG. 6 is a transmission electron microscope (TEM) image of a cross-section of a silicon substrate 45, a layer of silicon oxide or silicon oxy-nitride 46, a layer of boron nitride 48 and a layer of textured or columnar boron nitride 50 over layer of boron nitride 48. Boron nitride 48 may comprise amorphous, crystalline, textured or columnar and/or hexagonal boron nitride. In FIG. 6, the atoms 54 of crystalline silicon substrate 45 are shown. Layer of silicon oxide or silicon oxy-nitride 46 is amorphous. Layer of boron nitride 48 is above layer of silicon oxide 46. Layer of textured or columnar boron nitride 50 is above layer of boron nitride 48. Layer of textured or columnar boron nitride 50 has an upper surface 51. In layer of textured or columnar boron nitride 50 there are many vertical columns 52 of columnar boron nitride adjacent one another beginning at or near the upper surface of layer of boron nitride 48 and terminating at upper surface 51. The dimensions in FIG. 6 can be determined from the known spacing of Si atoms in crystalline silicon substrate 45 shown in FIG. 6. Crystalline silicon substrate 45 has a diamond crystal structure and a lattice constant of 5.43 Å.

Figure 7:
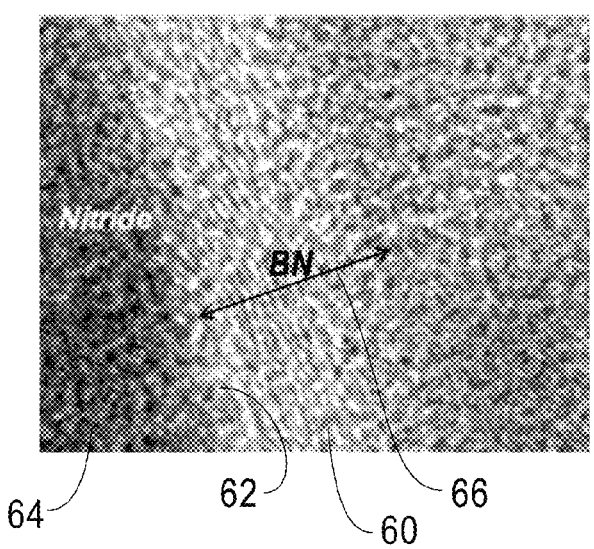
FIG. 7 is a TEM image of a cross-section view of a layer of textured or columnar boron nitride on a nitride mesa sidewall.

FIG. 7 is a TEM image of a cross-section view of a layer of textured or columnar boron nitride 60 on a nitride mesa sidewall 62 of nitride mesa 64. Arrow 66 shows the width of textured or columnar boron nitride 60.

Figure 8:
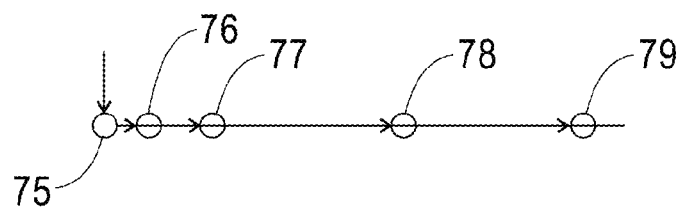
FIG. 8 is a flow chart of a typical CMOS integrated photoresist stripping and cleaning process.

FIG. 8 is a flow chart of a typical CMOS integrated photoresist stripping and cleaning process. The photoresist process may comprise for example the following steps. A photoresist layer is formed and patterned over a layer of material on a substrate. The material may be suitable for spacers 162 and 164 positioned on either side of gate electrode 158 of a MOS transistor 150 shown in FIG. 12. The layer of material is subjected to a reactive ion etch (RIE) process 75 well known in the art shown in FIG. 8 to transfer the photoresist pattern into a layer of material on substrate 112 shown in FIG. 12. Substrate 112 may have semiconductor region 116 and shallow trench isolation trenches 120 of textured or columnar boron nitride 138 surrounding semiconductor region 116.

After the layer of material is patterned, the photoresist layer is subjected to an etchant of Dilute Hydrofluoric (DHF) acid (100:1) for 5 min, shown as process 76 shown in FIG. 8. Next, an $O_2$ plasma ashing process for 200 sec. to consume the organic material of photoresist layer is performed as process 77 shown in FIG. 8. Next, the exposed semiconductor regions, patterned layer and textured or columnar boron nitride surfaces are cleaned in sulfuric/nitric acid solution at 150° C. for 10 min, shown in FIG. 8 as process 78 in FIG. 8. Then, the exposed semiconductor regions, patterned layer and textured or columnar boron nitride surfaces are subject to an etchant of Dilute Hydrofluoric (DHF) acid (100:1) for 5 min, shown as process 79 in FIG. 8.

Figure 9:
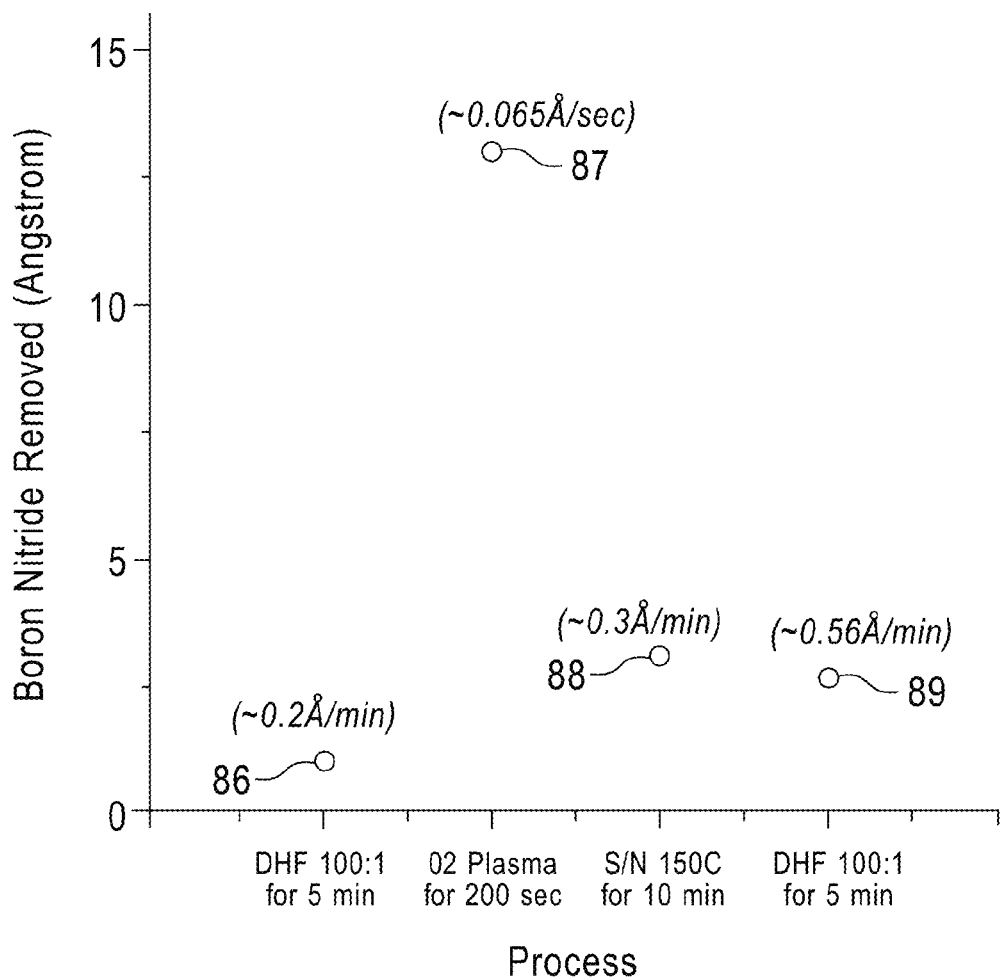
FIG. 9 is a graph of the thickness reduction or removal of textured or columnar boron nitride during the semiconductor processes shown in FIG. 8.

FIG. 9 is a graph of the boron nitride removed during processes 76-79, respectively. In FIG. 9 the ordinate represents the removed textured or columnar boron nitride in Angstroms and the abscissa represents each process 76-79, respectively. The removal of textured or columnar boron nitride is cumulative as the shallow trench isolation trenches of textured or columnar boron nitride passes through two or more processes 76-79.

Process 77 shown by data point 86 has a rate of removal of 1 Å/5 min. of textured or columnar boron nitride. Process 76 has a rate of removal of 0.2 Å/min. Process 77 shown by data point 87 has a rate of removal of 13 Å/200 sec. of textured or columnar boron nitride. Process 76 has a rate of removal of 0.065 Å/sec. Process 78 shown by data point 88 has a value of 3 Å/10 min. of removal of textured or columnar boron nitride. Process 78 has a rate of removal of 0.3 Å/min. Process 79 shown by data point 89 has a value of 2.8 Å/5 min. of removal of textured or columnar boron nitride. Process 79 has a rate of removal of 0.56 Å/min By contrast, the removal of thermal oxide (900° C.) in DHF 100:1 etch rate is 30 Å/min as reported in the literature. The removal of PECVD oxide (400° C.) in DHF 100:1 etch rate is 128 Å/min as reported in the literature and the removal of High Temperature Oxide (HTO) (700° C.) for CMOS STI fill in DHF 100:1 etch rate is 85 Å/min as reported in the literature.

Figure 10:
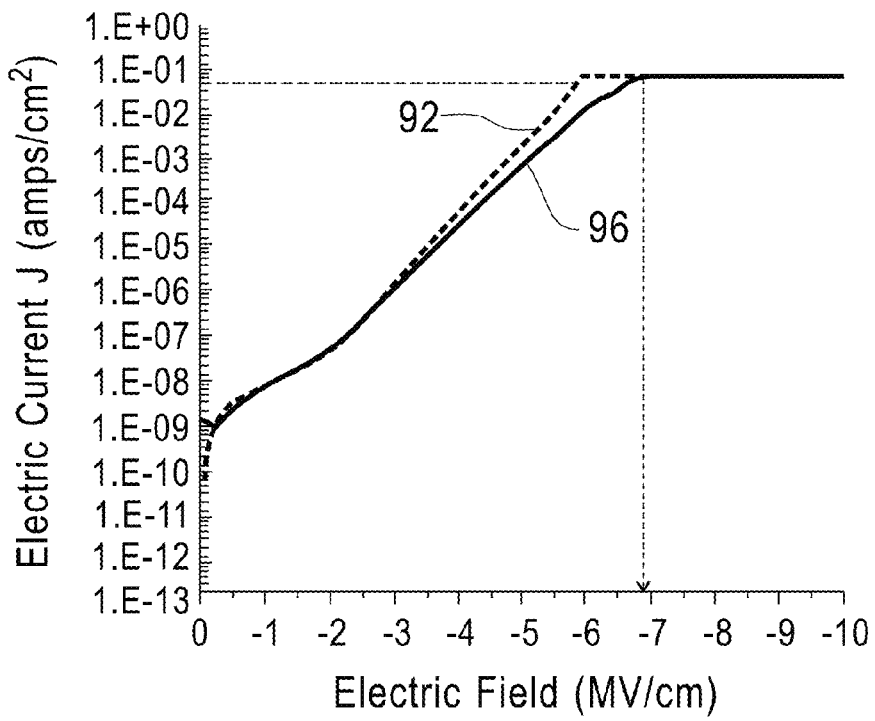
FIG. 10 is a graph of electric current versus electric field across a layer of boron nitride.

FIG. 10 is a graph of electric current versus electric field across a layer of textured or columnar boron nitride. In FIG. 10, the ordinate represents Electric Current J in amps/cm$^2$ and the abscissa represents Electric Field in MV/cm. Textured or columnar boron nitride was deposited on a wafer with an as-deposited thickness of 285 Angstroms. The boron nitride was patterned into 49 dots on a wafer with metal above and below the dot to form a capacitor. Curve 92 shows the electric current versus electric field measured at 25° C. of as-deposited boron nitride and curve 96 shows the electric current versus electric field measured at 25° C. of boron nitride after a post spacer RIE process. The thickness of the layer after the post spacer RIE process was 203 Å. The dielectric constant k for the samples measured for curve 92 was 6.08 and the dielectric constant k for the samples measured for curve 96 was 4.55. For an electric current detection at 5.E-04 amp, the breakdown electric field was 4.3 MV/cm for both curves 92 and 96. For a current detection at 5.E-01, the breakdown electric field was 6.0 MV/cm for curve 92 and 6.9 MV/cm for curve 96.

Figure 11:
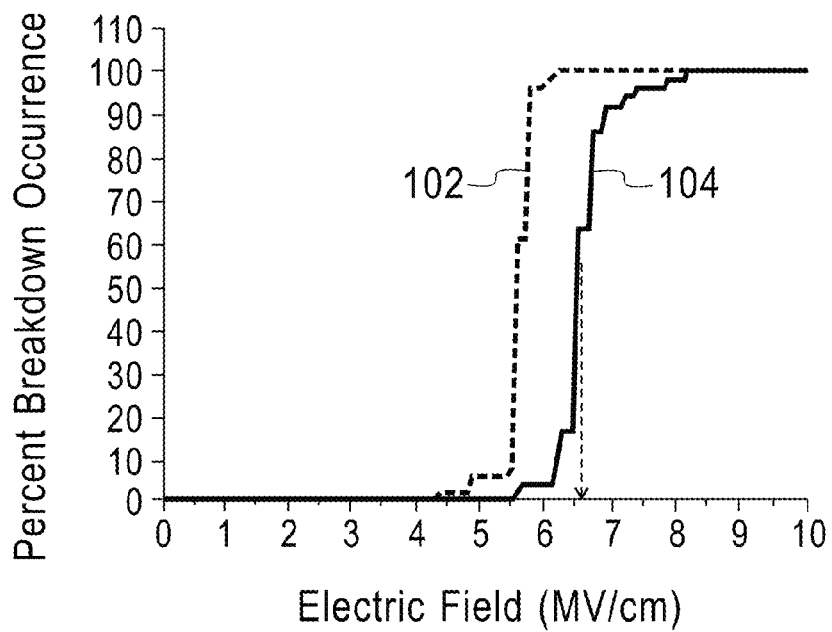
FIG. 11 is a graph of the percent breakdown occurrence versus an electric field across a layer of textured or columnar boron nitride.

FIG. 11 is a graph of Percent Breakdown Occurrence versus an Electric Field across a layer of textured or columnar boron nitride. In FIG. 11, the ordinate represents Percent Breakdown Occurrence and the abscissa represents Electric Field in MV/cm. The textured or columnar boron nitride was deposited on a wafer at 400° C. Curve 102 shows the percent breakdown occurrence versus electric field at 25° C. on an as-deposited layer and curve 104 shows the percent breakdown occurrence versus electric field at 25° C. on a layer after a post spacer RIE process. As shown by curves 102 and 104, textured or columnar boron nitride does not have a catastrophic breakdown electric field. The breakdown electric field in the as-deposited boron nitride layer or film shown in curve 102 and in the boron nitride layer or film after a post spacer RIE process shown in curve 104 are defined only by current detection at 5E-04 amps. The Breakdown electric field distribution between curves 102 and 104 remains tight or close together i.e. very low defectivity or defectiveness.

Figure 12:
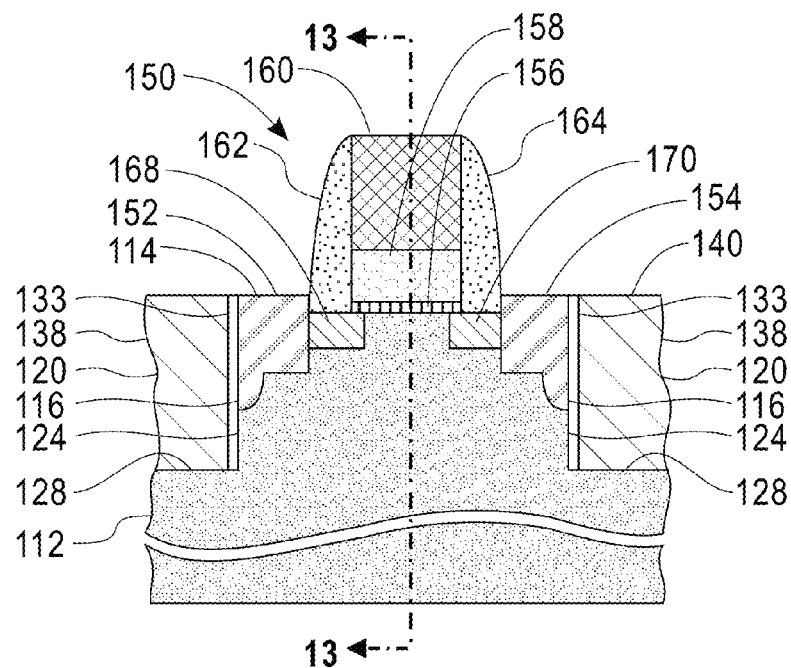
FIG. 12 is a cross-section view of a second embodiment of the invention showing a transistor in a semiconductor region with STI including textured or columnar boron nitride and/or hexagonal boron nitride.

FIG. 12 is a cross-section view of a second embodiment of the invention. FIG. 12 shows a semiconductor substrate 112 having an upper surface 114 and a semiconductor region 116 having an upper surface 114 and bounded by a plurality of trenches 120. Plurality of trenches 120 have sidewalls 124 on semiconductor region 116 and a trench bottom 128 on semiconductor substrate 112. Semiconductor substrate 112 and semiconductor region 116 may comprise Si, Group III-V, Ge, SiGe and combinations thereof.

Plurality of trenches 120 may have a liner 133 on sidewalls 124. Plurality of trenches 120 have an insulating material 138 filled therein to substantially fill plurality of trenches 120 to an upper surface 140. Upper surface 140 may be coplanar with upper surface 114. Insulating material 138 may comprise a nitride such as textured or columnar boron nitride and/or hexagonal boron nitride. Liner 133 may comprise silicon nitride and provides an adhesion layer and a diffusion barrier to atoms from insulating material 138.

Plurality of trenches 120 are shown on either side of semiconductor region 116 to provide isolation. A transistor 150 is shown formed on semiconductor region 116. Transistor 150 has a drain 152, a source 154, a gate oxide 156, a gate electrode 158 and a gate conductor 160. Gate sidewall spacers 162 and 164 are formed on either side of gate oxide 156, gate electrode 158 and gate conductor 160. Drain extension 168 and source extension 170 are formed below gate sidewall spacers 162 and 164, respectively and under a portion of gate oxide 156. In FIG. 12, the upper surface 140 of insulating material 138, liner 133 and upper surface 114 are substantially coplanar so that the gate electrode 158 and gate conductor 160 are not exposed to sidewalls 124 and do not form on sidewalls 124 at times gate electrode 158 and/or gate conductor 160 are formed and passes over liner 133, and upper surface 140 of insulating material 138 from upper surface 114.

Figure 13:
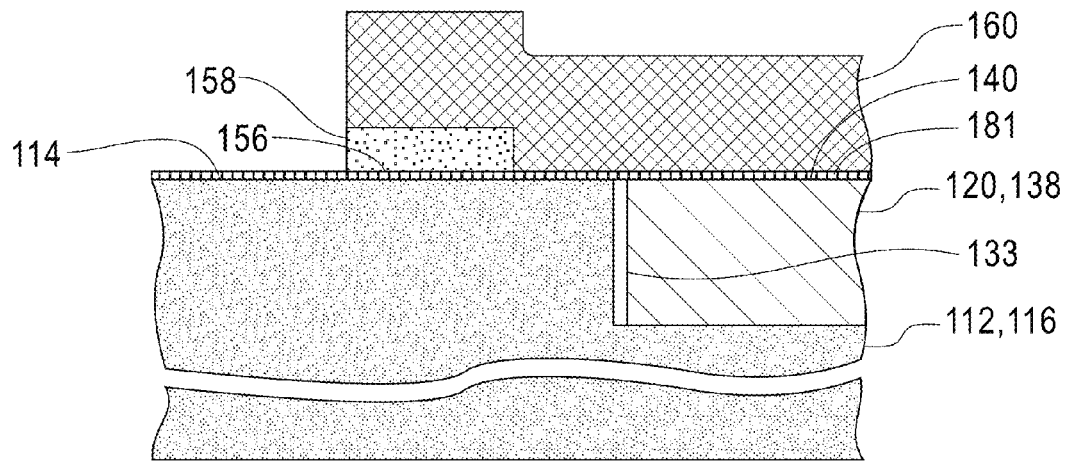
FIG. 13 is a cross-section view along the lines 13-13 of FIG. 12.

FIG. 13 is a cross-section view along the lines 13-13 of FIG. 12 showing gate electrode 158 and gate conductor 160 above gate oxide 156. Gate conductor 160 passes over gate oxide 156 which is above upper surface 114, liner 133 and upper surface 140. Upper surface 114, liner 133 and upper surface 140 has insulation layer 181 there over to insulate gate conductor 160. Insulation layer 181 may not be necessary to extend over liner 133 and upper surface 140 since liner 133 and insulting material 138 are already insulators. FIG. 12 does not show insulating layers 180 and 181. As shown in FIG. 13, upper surface 114, the upper surface of liner 133 and upper surface 140 are substantially coplanar to prevent gate conductor 160 to be on or over sidewall 124 so as to form a parasitic transistor resulting in unwanted leakage current. Further as shown in FIG. 13, the upper surface 114, upper surface of liner 133 and upper surface 140 are substantially coplanar due to the use of textured or columnar boron nitride and/or hexagonal boron nitride for insulating material 138 which exhibits an extremely low etch rate in wet solutions, HF, and RIE resulting in insignificant height difference between the upper surface 140 and upper surface 114 as wafers proceed through a chip manufacturing process. STI or insulating material 138 upper surface 140 height non-variation is a key contributor to reduce Across Chip Linewidth Variation (ACLV). Further, low STI edge erosion resulting from manufacturing processes formed less severe "divots" leading to reduced chip failure due to the reduced electric field or corner device where the gate conductor 160 overlaps the shallow trench isolation areas between transistors or devices on respective semiconductor regions 16 and 18.

While there has been described and illustrated a substrate incorporating semiconductor regions electrically isolated laterally by shallow trenches filled with textured or columnar and/or hexagonal boron nitride and a process for filling shallow trenches in a semiconductor substrate with columnar texture boron nitride using pulsed plasma enhanced chemical vapor deposition (Pulsed PECVD) and plasma assisted atomic layer deposition (PAALD), it will be apparent to those skilled in the art that modifications and variations are possible without deviating from the broad scope of the invention which shall be limited solely by the scope of the claims appended hereto.

What is claimed is:

1. A method of forming a structure comprising
   selecting a semiconductor substrate having an upper surface;
   forming a plurality of trenches having sidewalls and a bottom in said upper surface of said semiconductor substrate to form a plurality of semiconductor regions bounded by said plurality of trenches;
   forming a liner layer on said sidewalls and said bottom of said trenches; and
   substantially filling said plurality of trenches with an insulating material comprising columnar textured boron nitride, said substantially filling includes a process selected from the group consisting of pulsed plasma enhanced chemical vapor deposition (Pulsed PECVD) and plasma assisted atomic layer deposition (PAALD), said process operating with said semiconductor substrate at a temperature in a range from 150° C. to 400° C.

2. The method of claim 1 wherein said Pulsed PECVD process includes flowing $B_2H_6$, $H_2$ and $N_2$ into a chamber;
   forming a first plasma in said chamber for a first time period;
   terminating said plasma;
   flushing said chamber for a second time period by flowing $H_2$ and $N_2$ into said chamber; and
   forming a second plasma in said chamber for a third time period with $H_2$ and $N_2$ and without $B_2H_6$ present.

3. The method of claim 1 further including repeating the process of claim 2.

4. The method of claim 1 wherein said PAALD process includes flowing $B_2H_6$ into a chamber for first time period;
   flushing said chamber for a second time period by flowing a first gas selected from the group consisting of $H_2$, $N_2$, He and Ar,
   introducing a nitriding gas into said chamber;
   forming a plasma for a third time period; and
   terminating said plasma.

5. The method of claim 4 further including flushing said chamber for a fourth time period by flowing said first gas; and
   repeating the process of claim 4.

* * * * *